US012666635B2

(12) United States Patent
Ngwendson et al.

(10) Patent No.: US 12,666,635 B2
(45) Date of Patent: Jun. 23, 2026

(54) IGBT WITH A VARIATION OF TRENCH OXIDE THICKNESS REGIONS

(71) Applicants:Dynex Semiconductor Limited, Lincolnshire (GB); Zhuzhou CRRC Times Semiconductor Co. Ltd., Hunan (CN)

(72) Inventors: Luther-King Ekonde Ngwendson, Lincolnshire (GB); Ian Deviny, Lincolnshire (GB)

(73) Assignees: DYNEX SEMICONDUCTOR LIMITED, Lincolnshire (GB); ZHUZHOU CRRC TIMES SEMICONDUCTOR CO. LTD., Hunan (CN)

( * ) Notice: Subject to any disclaimer, the term of this patent is extended or adjusted under 35 U.S.C. 154(b) by 878 days.

(21) Appl. No.: 17/413,118

(22) PCT Filed: Jun. 18, 2020

(86) PCT No.: PCT/EP2020/066907
§ 371 (c)(1),
(2) Date: Jun. 11, 2021

(87) PCT Pub. No.: WO2021/254617
PCT Pub. Date: Dec. 23, 2021

(65) Prior Publication Data
US 2022/0320322 A1     Oct. 6, 2022

(51) Int. Cl.
*H10D 12/00* (2025.01)
*H10D 12/01* (2025.01)
*H10D 62/10* (2025.01)

(52) U.S. Cl.
CPC ......... *H10D 12/481* (2025.01); *H10D 12/038* (2025.01); *H10D 62/127* (2025.01)

(58) Field of Classification Search
CPC ............. H01L 29/7397; H01L 29/0696; H01L 29/42368; H10D 12/481; H10D 12/038
See application file for complete search history.

(56) References Cited

U.S. PATENT DOCUMENTS

2008/0315249 A1    12/2008   Minato
2015/0295034 A1    10/2015   Laven
                (Continued)

FOREIGN PATENT DOCUMENTS

WO            0219434 A1       3/2002
WO         2018215727 A1      11/2018
WO     WO-2018215729 A1 *    11/2018   ....... H01L 21/76205

OTHER PUBLICATIONS

International Search Report and Written Opinion dated Mar. 16, 2021 for corresponding International Patent Application No. PCT/EP2020/066907.

*Primary Examiner* — Vincent Wall
(74) *Attorney, Agent, or Firm* — Tarolli, Sundheim, Covell & Tummino LLP

(57) ABSTRACT

We describe herein a gate controlled bipolar semiconductor device comprising a collector region of a first conductivity type, a drift region of a second conductivity type located over the collector region, a body region of a first conductivity type located over the drift region, a body region of a second conductivity type located over the drift region, at least one first contact region of a second conductivity type located above the body region and having a higher doping concentration compared to the body region, at least one second contact region of a first conductivity type located laterally adjacent to the at least one first contact region, the at least one second contact region having a higher doping concentration than the body region, at least one active trench extending from a surface into the drift region, wherein the at least one first contact region adjoins at least one active (Continued)

trench so that, in use, a channel region is formed along said at least one active trench and within the body region, and at least two auxiliary trenches extending from the surface into the drift region. The at least two auxiliary trenches each comprise two vertical sidewalls and a bottom surface between the two vertical sidewalls, and an insulation layer along the vertical sidewalls and the bottom surface. The thickness of the insulation layer along the two vertical sidewalls of the at least two auxiliary trenches is less than 1500 Å. The body region of a first conductivity type and the body region of a second conductivity type are both located at least between two adjacent auxiliary trenches.

18 Claims, 11 Drawing Sheets

(56)                    References Cited

U.S. PATENT DOCUMENTS

| | | |
|---|---|---|
| 2015/0318386 A1 | 11/2015 | Onozawa |
| 2017/0018636 A1 | 1/2017 | Naito |
| 2018/0090594 A1* | 3/2018 | Baburske .......... H01L 21/76224 |
| 2018/0204909 A1* | 7/2018 | Konishi .............. H10D 84/617 |
| 2018/0366541 A1 | 12/2018 | Laven |
| 2019/0123186 A1 | 4/2019 | Philippou |
| 2019/0273152 A1* | 9/2019 | Yilmaz .............. H01L 21/3086 |
| 2020/0091328 A1* | 3/2020 | Ngwendson ......... H10D 64/117 |

* cited by examiner (a)

(b)

(c)

(d)

(e)

(f)

(g)

(h)

925

920

915

910

(a)

925

Y

920

915

910

(b)

IGBT WITH A VARIATION OF TRENCH OXIDE THICKNESS REGIONS

RELATED APPLICATIONS

The present application is a U.S. National Stage application under 35 USC 371 of PCT Application Serial No. PCT/EP2020/066907, filed on 18 Jun. 2020; the entirety of which is incorporated herein by reference.

TECHNICAL FIELD

The present disclosure relates to a semiconductor device with a thin oxide layer on auxiliary trench sidewalls and n-well and p-well layers located between adjacent auxiliary trenches.

BACKGROUND

Power semiconductor devices are often used as switches as they operate in both on and off states. In the on-state a device can conduct high currents, and conduction losses are desired to be reduced. In the off-state a device can withstand the system maximum voltage with little or no current passing.

Insulated gate bipolar transistors (IGBTs) have the combined advantage of metal-oxide semiconductor (MOS) gate drive with the high current densities found in bipolar transistors. Bipolar transistors make use of conduction by majority and minority carriers. This means that bipolar transistors have a high density of charge carriers. This high level of charge reduces on-state conduction losses ($V_{CE(sat)}$), but increases switching losses ($E_{OFF}$) and switching time.

Trench gate IGBTs with uniform thin oxide are lossy due to high gate emitter capacitance ($C_{GE}$) and gate collector capacitance ($C_{GC}$). Fast switching low loss IGBTs are much desirable in most applications. Also important are better $V_{CE(sat)}$, $E_{OFF}$ trade off and improved thermal performance. State-of-the-Art Devices have, Among Others, the Following Disadvantages:

no effect on turn on dl/dt for grounded dummy trenches;

capacitive coupling between the dummy and active trenches which can increase gate collector capacitance ($C_{GC}$) or miller capacitance;

turn-on dl/dt cannot be tuned and holes cannot be efficiently collected from the dummy area (the area not used for conduction in the on-state, and hosting the non-active trenches) during turn-off; and poor thermal performance.

WO0219434 relates to an IGBT device with thick oxide on the dummy trenches, this prevents dl/dt and dV/dt being controlled by grounding the dummy trenches. US 2018/0366541 and US 2019/0123186 also relate to semiconductor devices.

WO/2018/215727 relates to a semiconductor device with a recessed emitter trench and WO 2018/215729 relates to a semiconductor device with asymmetric thick oxide layers on trenches.

SUMMARY

Aspects and preferred features are set out in the accompanying claims.

According to a first aspect of the disclosure, there is provided a gate controlled bipolar semiconductor device comprising:

a collector region of a first conductivity type;

a drift region of a second conductivity type located over the collector region;

a body region of a first conductivity type located over the drift region;

a body region of a second conductivity type located over the drift region;

at least one first contact region of a second conductivity type located above the body region and having a higher doping concentration compared to the body region;

at least one second contact region of a first conductivity type located laterally adjacent to the at least one first contact region, the at least one second contact region having a higher doping concentration than the body region;

at least one active trench extending from a surface into the drift region, wherein the at least one first contact region adjoins at least one active trench so that, in use, a channel region is formed along said at least one active trench and within the body region, and at least two auxiliary trenches extending from the surface into the drift region, and wherein the at least two auxiliary trenches each comprise:

two vertical sidewalls and a bottom surface between the two vertical sidewalls; and an insulation layer along the vertical sidewalls and the bottom surface, wherein the thickness of the insulation layer along the two vertical sidewalls of the at least two auxiliary trenches is less than 1500 Å, and wherein the body region of a first conductivity type and the body region of a second conductivity type are both located at least between two adjacent auxiliary trenches.

The presently disclosed device has an n-well layer (body region of a second conductivity type) under a p-well layer (body region of a first conductivity type) in both the active and dummy mesa regions. The mesa region refers to the region between adjacent trenches. Having the body region of a second conductivity type under the body region of a first conductivity type, means that the built-in potential of the pn junction creates a barrier for holes attempting to flow towards emitter contact openings in the dummy regions. This creates a hole-storage effect (as hole density/concentration builds up) which modulates the resistivity of device and lowers the voltage drop across the device in the on-state ($V_{CE(sat)}$) due to enhanced conductivity modulation. Without the n-well, holes from the collector region will flow unhindered towards emitter contacts and be collected leading to higher $V_{CE(sat)}$ or voltage drop or conduction loss across the device.

The second contact region of a first conductivity type reduces reliability problems and RBSOA failure due to high resistance at the emitter contacts within the p-well regions between adjacent auxiliary trenches.

Since the auxiliary trenches are held at emitter potential (0V), a hole-inversion layer is formed along the lower portions of the trench in contact with n-base and n-well. The hole-inversion layer is a low resistance path for holes which enhances hole collection rate hence turn-off speed. During turn-on holes in the inversion layer also aid the vertical pnp action to speed up initial device turn-on and turn-on dl/dt. The n-well layer increases the potential difference between poly and the trench, which increases the level of charge.

The at least one body region of a first conductivity type may have a doping concentration of $1\times10^{17}$ to $5\times10^{17}$ cm$^{-3}$ and the at least one body region of a second conductivity type may have a doping concentration of $5\times10^{16}$ to $1\times10^{17}$ cm$^{-3}$.

The auxiliary (dummy) trenches have a thin (gate oxide) insulation layer. Thin oxide refers to an oxide insulation layer having a thickness between 500 Å (50 nm) and 1500 Å (150 nm). The thin oxide layer increases hole accumulation or hole storage in the body regions of a second conductivity type (n-well regions) around the auxiliary trenches. The charge storage allows alteration of switching. At high potential difference between the collector and emitter terminals (Vce), negative potential across the thin oxide layer on the dummy trenches creates sufficient electric field to form a hole inversion channel in the lower portions of the trench (in contact with the drift region and the body region of a second conductivity type (the n-type silicon)). This increases the build-up of plasma at turn-on and increases dl/dt. This effect is not seen with thick oxide insulation layers. Thick oxide refers to an oxide insulation layer having a thickness between 2500 Å to 5000 Å.

The active trenches may have thin gate oxide only in a portion of the sidewall where conducting channels are formed and thick oxide on the other sidewall and bottom.

The auxiliary trenches refer to trenches that do not have a gate channel. The dummy (auxiliary) trenches may be connected to the emitter potential via an emitter metal contact. This disables capacitive coupling between the dummy and active trenches. This leads to reduced $C_{GC}$, faster rate of turn-on dV/dt and dl/dt and reduced gate charge. This also means that during turnoff, there is faster capacitive discharge allowing Vce to rise faster towards the switching voltage.

The device of the present disclosure has the following advantages over state-of-the-art devices:

auxiliary trenches configured at ground potential with a thin oxide insulation layer increase the turn on dl/dt;

a thin oxide insulation layer on the grounded auxiliary trenches allows reduced capacitive coupling between the dummy and active trenches. This reduces gate collector capacitance and increased turn-on dl/dt;

electrical contacts to the p-well region between adjacent auxiliary trenches allows turn-on dl/dt to be tuned and holes to be efficiently collected from the dummy area during turn-off;

contacts to the p-well regions enclosed between auxiliary (dummy) trenches prevents lateral flow of holes which can degrade reverse bias safe operating area (RBSOA);

electrical contacts to auxiliary trenches and/or the p-well regions between adjacent auxiliary trenches improve thermal performance;

separate contacts to the auxiliary trenches and the p-well region between auxiliary trenches to improve reliability.

The insulation layer along the two vertical sidewalls of the at least two auxiliary trenches may comprise a substantially constant thickness.

The second contact region may be located between two laterally spaced first contact regions.

The device may be configured such that the at least two auxiliary trenches are biased at a ground potential.

The device may further comprise a metal emitter contact. The metal emitter contact may be connected to the at least two auxiliary trenches. This connects the auxiliary trenches to the emitter potential.

The device may further comprise an emitter trench extending from the surface into the drift region. The second contact region may adjoin the emitter trench.

The emitter trench may be located between two active trenches. The active gate trenches may surround the emitter trench, which means that it is protected from high electric fields and can have a smaller width and shallower depth without degrading the breakdown voltage. In other words, the active gate trenches may shield the emitter trench from high electric fields so that emitter trench width can be smaller (or have some sort of modulation) and its depth made shallower than active gate trench without any degradation in breakdown voltage. This increases the degree of miniaturisation of the active cell dimension.

The active trenches and the emitter trench may have the same width in the first dimension. Alternatively, the active trenches and the emitter trench may have different widths in the first dimension. The active trenches and the emitter trench can have a symmetrical shape or an asymmetrical shape. The depth of the active trenches can be more than the depth of the emitter trench or less than the depth of the emitter trench. Alternatively, the depth of the active trenches and emitter trench can be substantially the same.

The device may further comprise an oxide layer at a bottom sidewall that may be thicker than an oxide layer at vertical sidewalls of one of more of the active and emitter trenches. The thick oxide improves immunity to high electric field stress and harnesses the device breakdown voltage.

The device may be configured such that the emitter trench is biased at ground potential.

The metal emitter contact may be connected to the emitter trench.

The active trench and the emitter trench may be laterally spaced in a first dimension (or a horizontal direction or X-direction). The current may flow in the device in a second dimension (or a vertical direction or Y-direction) substantially transverse to the first dimension. The active trench and emitter trench may extend in a third dimension (or Z-direction) of the device. The third dimension extends in a different direction compared with the first and second dimensions.

The second contact region may be formed at least partially within the emitter trench in the third dimension of the device. The width of the second contact region may be less than or equal to a width of the emitter trench. This reduces the hole collection area, which improves 'hole pile up' effect. This may enhance the conductivity modulation in the emitter region, reducing on-state conduction loss.

The second contact region may not extend into the body region of a first conductivity type or the body region of a second conductivity type, between the active trench and the emitter trench. The second contact region may extend into the emitter trench in the third dimension of the device. This allows the trench-to-trench dimension to be reduced as photolithographic limitations are removed. Freedom to miniaturise hole collection area in the on-state which enhances carrier density in the emitter region and reduces conduction loss ($V_{CE(sat)}$). As discussed above, during on-state and turn-off, hole current flowing to the emitter contact is separated from the electron current which significantly enhances the IGBT Safe Operating Area (RBSOA and SCSOA). The grounded emitter trench potential causes the holes in deep saturation and turn-off to flow vertically along the emitter trench sidewalls and collected at the emitter metal without having to flow under the n+ emitter. Hole current flowing under the n+ emitter causes latch up in IGBTs and limits Safe Operating Area.

The emitter trench may comprise a plurality of segments in the third dimension. The segments may be shaped such that at least a space is formed between two segments.

The second contact region may comprise a plurality of portions in the third dimension. Each portion may be located within the space formed between two segments of the emitter trench. The emitter trench and the p+ emitter/contact region may be at least partially segmented (or varied) in the third dimension whereas conventional devices vary only in two dimensions. This allows the trench-to-trench separation to be miniaturised further in the first dimension. The p+ emitter regions may extend within the emitter trench so that both the p+ emitter regions and emitter trench are at least partially segmented.

The segments of the emitter trench may be continuous segments having a substantially 'S' shape, where the portions of the second contact region each have a smaller width compared to the segments of the emitter trench. Alternatively, the segments of the emitter trench may be discontinuous segments, and the portions of the second contact region each may have a substantially equal width compared to the segments of the emitter trench. Alternatively, the segments of the emitter trench may have a cross shape having a variable width along the third dimension.

The emitter trench may be recessed from a surface of the device. The device may further comprise a region adjacent to the emitter trench. The region may comprise a first recessed portion extending from the surface of the device to the emitter trench. The emitter trench may be fully recessed. This generally results in a smaller width and a shallower depth for the emitter trench compared to the active trenches. This enables gate controlled bipolar transistors with reduced conduction loss ($V_{CE(sat)}$), enhanced $V_{CE(sat)}$/$E_{OFF}$ trade-offs and enhanced RBSOA and SCSOA parameters.

The grounded recessed emitter trench improves current handling capability and improve the safe operating areas (SOAs) in a power device such as an IGBT. The trench may be maintained at a grounded potential, forcing the hole current to flow vertically along the emitter trench side-walls. The hole current avoids the electron current within the p-well (or p-body) and avoids the region under the n+ emitter/p-well junction. This reduces the hole current flowing laterally through the p-well and suppresses latch-up in the device. The main purpose of the emitter trench is to tailor the hole flow path so it is desirable to make it smaller and shallower than the active gate trench to improve active cell density. The use of a fully recessed emitter trench means it is possible to have trench-to-trench separation less than or equal to about 0.5 μm without photolithographic limitations, and improves surface planarity and reliability.

The device may further comprise a second recessed portion that may extend from the first recessed portion into the emitter trench. When the emitter trench dimension becomes too small (e.g. less than 0.5 μm) it may be beneficial to have a first recessed portion larger than the emitter trench width. This improves hole collection area which can lower turn off energy loss.

The device may further comprise a silicide layer along the edges of the first and second recessed portions. The silicide layer can be titanium silicide ($TiSi_x$). $TiSi_x$ is used to electrically short the first contact (n+) and the second contact (p+) regions in the emitter regions because metal contact is only over the second contact (p+) regions.

The emitter trench may comprise two vertical sidewalls and a bottom surface between the two vertical sidewalls, and an insulation layer along the vertical sidewalls and the bottom surface.

The insulation layer along the two vertical sidewalls of the emitter trench may comprise a substantially constant thickness. The thickness of the insulation layer along the two vertical sidewalls of the emitter trench may be less than 1500 Å.

The emitter trench may be a recessed trench held at the emitter potential and referred to as a recessed emitter trench (RET). This may have a thin oxide lining similar to the dummy or auxiliary trenches. The RET is connected to the emitter potential. The RET reduces the mesa dimension and enhances conductivity modulation in the top cell (the top portion of the device where the emitter electrode is located) of the device i.e. significantly increased electron and hole density resulting in much lower $V_{CE(sat)}$. This is because the reduced mesa dimension increases the injection enhancement effect (IE) effect and enables the n-well to be significantly enhanced without BV degradation (reduction in breakdown voltage of the device). The bottom regions of all trenches with thin gate oxide lining are inverted at high Vce during turn-off.

The metal emitter contact may be electrically connected to the body region of a first conductivity type located at least between adjacent auxiliary trenches. In other words, contacts may be introduced in isolated regions bound by auxiliary trenches. The percentage of the emitter contacts connected to the body regions of a first conductivity type between the auxiliary trenches determine the percentage by which dI/dt at turn-on and $E_{OFF}$ (turn-off energy loss) can be tuned. Both $E_{OFF}$ and dI/dt reduce with increasing percentage of emitter contacts connected to the body region of a first conductivity type. It is advantageous to minimise the percentage of emitter contacts connected to the body regions of a first conductivity type because $V_{CE(sat)}$ increases with the percentage of emitter contacts connected to the body regions. This further enhances the turn-off speed, reduces $E_{OFF}$, and tunes dI/dt.

The metal emitter contact may be electrically connected to the body region of a first conductivity type located at least between adjacent auxiliary trenches by a plurality of isolated electrical contact regions each bound by trenches. In contrast, continuous contact along the dummy p regions (p-well regions between adjacent auxiliary trenches) will destroy the hole storage effect created by the n-well under the p-well region, reduce current density and increase $V_{CE(sat)}$. Instead of having a continuous emitter contact connected to the body region, the device may have only a small percentage of emitter contact connected to body region. This may be achieved by having isolated emitter contact openings that are confined to only the spaces between the auxiliary trenches. Confining these contacts between adjacent auxiliary trenches forces only vertical current paths and prevents lateral flow of holes, which is key to improved RBSOA in high voltage IGBTs.

An advantage of separating the emitter contacts connected to the auxiliary trenches and the emitter contacts connected to the body regions is that it avoids combined contact to silicon and polysilicon in order to enhance reliability performance. Combined contacts that connect to both trenches and body regions often suffer from wear out after several thousands of switching cycles due to the electron migration caused by high current densities arriving at such locations. In addition, some materials (such as aluminium) consumes different amounts to silicon at polysilicon at contacts, which is a reliability issue when making contacts to small areas and therefore reliability is increased by forming separate contacts to the auxiliary trenches and the body region between auxiliary trenches.

The hole inversion layer along dummy trenches creates a low resistance path to more efficiently collect holes flowing into the contacts to the dummy p regions. This means that excess holes in the dummy areas are quickly collected at the onset of turn-off leading to faster spread of the depletion edge from the pn junction and increased turn-off dV/dt.

The use of grounded p-well regions between adjacent auxiliary trenches reduces the maximum chip temperature. The contact to the dummy p regions makes the device much cooler in those regions.

The at least one active trench may comprise two vertical sidewalls and a bottom surface between the two vertical sidewalls; and an insulation layer along the vertical sidewalls and the bottom surface. The insulation layer along at least one vertical sidewall of the at least one active trench may comprise different thicknesses.

The insulation layer along at least one vertical sidewall of the at least one active trench may comprise a region with thickness greater than 2500 Å.

The insulation layer along said at least one vertical sidewall of the auxiliary trench may comprise a smaller thickness compared to the thickness of the insulation layer along the channel region of the at least one active trench. Here the channel region refers to the metal-oxide semiconductor (MOS) conduction channel that can be inverted by application of a potential to the active trench to allow passage of electrons. Here the insulation layer of the active trench having different thicknesses generally means that a relatively thin insulation layer (or oxide) is present along the channel area and a relatively thick insulation layer (or oxide) is present along the remaining portion of the trench (e.g. near the bottom sidewalls and the along the bottom surface). In one example, the insulation layer along one sidewall has both thin and thick layers and the insulation layer along another sidewall has only a thick layer. Furthermore, the manufacturing process of the device enables the formation of trenches with two types of oxide configurations simultaneously, for example, symmetric and asymmetric thick oxide regions by the LOCOS technique.

The active trenches may have a thick oxide layer or portion on vertical sidewall regions where conduction channels or accumulation layers are not formed. This reduces the gate collector capacitance ($C_{GC}$) and improves the switching speed. This reduces the turn on energy loss ($E_{ON}$) and the turn off energy loss ($E_{OFF}$). This thick oxide layer can be formed using of a technique/process called local oxidation of silicon (LOCOS). The active trenches may not have a thin oxide layer on regions where electron conduction channels are formed. This improves the dynamic performance of the device.

In the at least one active trench, the insulation layer along both vertical sidewalls may comprise different thicknesses.

The thickness of the insulation layer along a lower portion of each vertical sidewall of the at least one active trench may be greater than the thickness of the insulation layer along an upper portion of each vertical sidewall of the at least one active trench. This reduces the gate collector capacitance ($C_{GC}$), the gate charge and improves the switching speed. This lowers or reduces the turn on energy loss ($E_{ON}$) and the turn off energy loss ($E_{OFF}$). This improves the dynamic performance of the device.

In the at least one active trench, the insulation layer along one vertical sidewall may comprise different thicknesses and the insulation layer along another vertical sidewall may comprise a constant thickness. In other words, this is an asymmetric trench oxide layer in the active trench. This is advantageous as this configuration allows a thick oxide layer where conduction channels or accumulation layers are not formed, but does not result in a thick oxide in regions where electron conduction channels are formed.

The thickness of the insulation layer along a lower portion of a first vertical sidewall of the at least one active trench may be greater than thickness of the insulation layer along an upper portion of a first vertical sidewall of the at least one active trench, and the thickness of the insulation layer along a lower portion of a second vertical sidewall of the at least one active trench may be the same as the thickness of an upper portion of a second vertical sidewall of the at least one active trench. This configuration allows a thick oxide layer in regions where conduction channels are not formed, and a thin oxide layer in regions where there is no conduction channel.

The thickness of the insulation layer along the bottom surface of at least one active trench may be the same as the thickness of the insulation layer along the lower portion of both vertical sidewalls.

The vertical length of the lower portion may be greater than the vertical length of the upper portion of a vertical sidewall of the at least one active trench. The ratio of the vertical length of the lower portion and the vertical length of the upper portion may be equal to or greater than 1. This ratio may be adjusted to alter $C_{GC}$. In this way, the device performance can be adjusted.

The channel region may be formed along the insulation layer along the upper portion.

The device may not have a thick insulation layer formed in the region between trenches, known as the mesa region. Advantageously, if thick oxide is not formed in the mesa regions and the emitter trench, there is hole accumulation in these regions. During turn-off this allows the holes to flow closer to the emitter trench. This prevents latch-up and enhances the Safe Operating Area (SOA) of the device.

The device may be an insulated gate bipolar transistor (IGBT). Alternatively, the device could be a MOS controlled thyristor.

The device may further comprise a charge storage layer of a second conductivity type between the drift region and body region. The charge storage layer enhances the plasma density in the top cell of bipolar devices such as IGBTs by increasing the barrier height for holes flowing to the emitter.

The collector may comprise a plurality of first segments of a first conductivity type and a plurality of second segments of a second conductivity type, where the first and second segments may be laterally adjacent to one another. The device may be a reverse conducting insulated gate bipolar transistor (RC-IGBT). In RC-IGBTs the emitter contact area can be much less than conventional IGBT. Also, reduced trench to trench spacing can relax optimisation requirements between regions of a first and second conductivity type in the collector region.

The semiconductor device may be an insulated gate bipolar transistor (IGBT). The IGBT disclosed herein may be used in many applications such as motor drives, converters, or HVDC applications.

Alternatively, the semiconductor device may be a MOS controlled thyristor.

According to a further aspect of the present disclosure, there is provided a method of manufacturing a gate controlled bipolar semiconductor device comprising:

forming a collector region of a first conductivity type;

forming a drift region of a second conductivity type located over the collector region;

forming a body region of a first conductivity type located over the drift region;

forming a body region of a second conductivity type located over the drift region;

forming at least one first contact region of a second conductivity type located above the body region and having a higher doping concentration compared to the body region;

forming at least one second contact region of a first conductivity type located laterally adjacent to the at least one first contact region, the at least one second contact region having a higher doping concentration than the body region;

forming at least one active trench extending from a surface into the drift region, wherein the at least one first contact region adjoins at least one active trench so that, in use, a channel region is formed along said at least one active trench and within the body region, and forming at least two auxiliary trenches extending from the surface into the drift region, and wherein the at least two auxiliary trenches each comprise:

two vertical sidewalls and a bottom surface between the two vertical sidewalls; and an insulation layer along the vertical sidewalls and the bottom surface, wherein the thickness of the insulation layer along the two vertical sidewalls of the at least two auxiliary trenches is less than 1500 Å, and wherein the body region of a first conductivity type and the body region of a second conductivity type are both located at least between two adjacent auxiliary trenches.

The method may further comprise forming an emitter trench extending from the surface into the drift region, and wherein the second contact region adjoins the emitter trench.

The at least one active trench and at least one auxiliary trench are manufactured using the steps of:

performing an etching process to form the one or more trenches;

forming a first insulation layer on a lower surface and sidewalls of the one or more trenches;

depositing a hydrophilic layer on the lower surface and sidewalls of the one or more trenches;

depositing a photoresist material in the one or more trenches, wherein depositing a photoresist material comprises exposing the hydrophilic layer on an upper region of a first side of the one or more trenches;

performing a wet etch process to etch the first insulation layer on the sidewall of the first side of the one or more trenches to a predetermined distance below a surface of the photoresist material;

removing the photoresist material;

removing the hydrophilic layer; and after performing the wet etch process, removing the photoresist material, and removing the hydrophilic layer; forming a second insulation layer on the sidewall of the first side of the one or more trenches.

The presently disclosed method of manufacturing a semiconductor device includes a step of depositing a hydrophilic layer. The hydrophilic layer means that the etchant, in the later step of performing a wet etch, uses capillary action to etch the insulation layer on the sidewalls, below the surface of the photoresist material. The capillary action etches down a channel between the hydrophilic layer and the material (for example, silicon) of the semiconductor device outside the trench. This also allows etching below the surface of the insulation layer, allowing deeper channels to be etched. Furthermore, this helps to achieve uniformity and consistency in both the etching process and the width and depth of the etched portion of the insulation layer. This also increases the controllability of the manufacturing process, in particular the width and depth of the etched portion.

The disclosed manufacturing process includes performing a wet etch that etches down a channel along the sidewall of the trench. This process facilitates the manufacture of devices having trenches with asymmetric or symmetric trench regions, having two different insulation layer thicknesses on a sidewall of a trench.

The herein disclosed manufacturing process improves uniformity of channel etch depth and width, and therefore improves electrical performance uniformity from die to die. The disclosed process also has improved process control and yield. The disclosed process results in a reduced number of defects caused by instability of photoresist during wet etch down deep trenches, compared to state-of-the-art methods of manufacturing trenches.

The method may be used to process devices of Silicon, SiC, GaN, and other materials used in semiconductor devices.

Depositing a photoresist material may be a two-step process that includes depositing a photoresist material and then exposing the hydrophilic layer on an upper region of a first side of the one or more trenches.

Forming a first insulation layer may comprise forming a thin insulation layer, and forming a second insulation layer may comprise forming a thick insulation layer over the thin insulation layer, where the thin insulation layer is thinner than the thick insulation layer.

Forming a thick insulation layer may comprise thermally growing a thick oxide layer using a local oxidation of silicon process.

Forming a thick insulation layer may comprise depositing a thick oxide layer.

Depositing a thick oxide layer may be carried out using Tetraethyl Orthosilicate (TEOS) deposition. TEOS deposition is very conformal.

The thick insulation layer may have a thickness between 1800 Å and 5000 Å. Preferably, the thick insulation layer may have a thickness greater than 2500 Å.

Growing a thin insulation layer may comprise thermally growing a thin oxide layer at 900° C. to 1100° C.

The thin insulation layer may have a thickness between 500 Å to 1800 Å. Preferably, the thin insulation layer may have a thickness less than 1500 Å.

The method may further comprise depositing a filling material after forming the second insulation layer.

The hydrophilic layer may comprise nitride. The hydrophilic layer may comprise $Si_xN_y$ (silicon nitride) or another material with good wettability or a high degree of wetting. The wettability modulates etch rate down trench side-walls, and enables uniformity of etch distance and repeatability of the process. If wettability is not sufficient, some areas will etch faster than others down the trench walls by the capillary action. A material with high degree of wetting improves the capillary action that etches down a channel. The wettability property of the hydrophilic layer allows accurate control of etch depth and ensures uniformity of the etch process down the etched channel.

The hydrophilic layer may have a thickness between 1000 Å and 2500 Å. The thickness of the hydrophilic layer mains integrity during the wet etch/capillary etch process.

The step of performing a wet etch may be carried out using a buffered oxide etch. The semiconductor device or wafer may be immersed in the BOE in order to etch the insulation layer along any exposed mesa region and trench sidewalls.

Exposure to the bottom of deep trenches is difficult except for very wide trenches. The use of a wet etch means that exposure to the bottom of the trench is not required. The wet etch makes use of capillary action of the etch solution (such as BOE 7:1 HCL) to etch down the exposed sidewall and up the second trench sidewall to a desired distance.

The buffered oxide etch may comprise hydrofluoric acid. Hydrofluoric acid is a suitable solution for use in semiconductor manufacturing, and provides sufficient etch rate to make the process manufacturable.

The method may comprise manufacturing one or more trenches with an asymmetric insulation layer.

The method may comprise manufacturing one or more trenches with a symmetric insulation layer, and depositing a photoresist material may comprise exposing the hydrophilic layer on an upper region of two sides of the one or more trenches. The method may further comprise performing a wet etch process to etch the insulation layer on two sidewalls of the one or more trenches to a predetermined distance below a surface of the photoresist material; and growing a thin insulation layer on the two sidewalls of the one or more trenches.

The method may comprises manufacturing at least two trenches each with an insulation layer, wherein a first trench is separated from a second trench by a mesa region between the two trenches; and wherein the first side of the first trench is adjacent to the first side of the second trench; and wherein depositing a photoresist material comprises exposing the hydrophilic layer in the mesa region between the first and second trenches.

The method may further comprise removing the hydrophilic layer in the mesa region between the two trenches. This allows the oxide in the mesa region to be removed by etching, as the oxide in the mesa region is therefore not protected by the hydrophilic layer. This also removes the hydrophilic layer above the oxide on the trench sidewall so that the oxide on the sidewall can be etched.

The method may further comprise performing a wet etch process to etch the insulation layer on the mesa region.

BRIEF DESCRIPTION OF THE DRAWINGS

The present disclosure will be understood, by way of example only, from the detailed description that follows and from the accompanying drawings in which:

FIG. 6($b$) shows simulated temperature in a semiconductor device in which the region between auxiliary trenches is biased at ground potential, according to an embodiment of the disclosure;

DETAILED DESCRIPTION OF THE PREFERRED EMBODIMENTS

Figure 1:
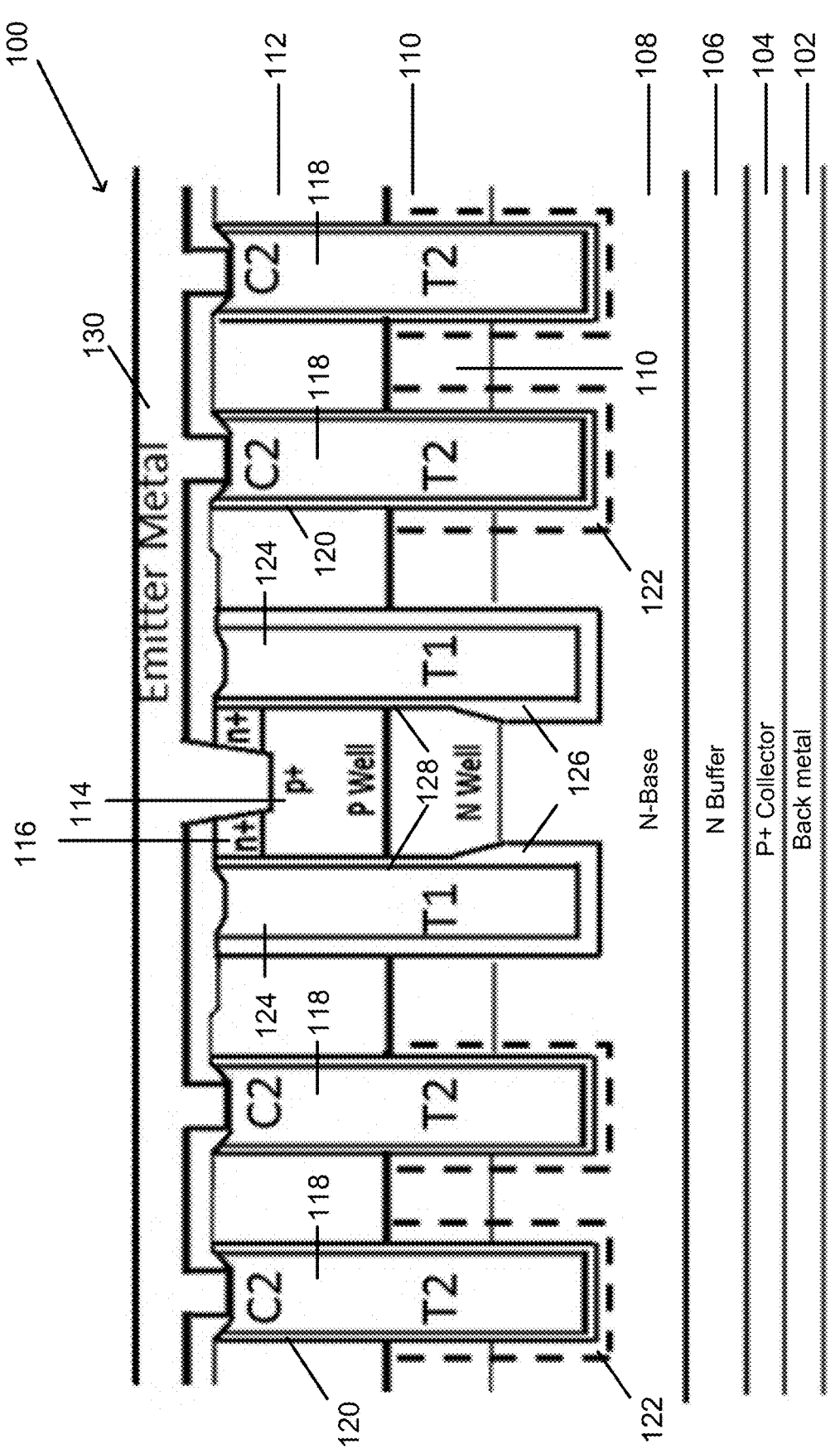
FIG. 1 illustrates a cross-sectional view of a semiconductor device according to an embodiment of the disclosure.

FIG. 1 illustrates a cross-sectional view of a semiconductor device 100 according to an embodiment of the disclosure. In this embodiment, the device 100 includes an n-type voltage sustaining region or n-base (or a drift region) 108 over a collector p+ layer (substrate) 104. The collector p+ layer 104 is, for example, a p-type diffusion on the backside that supplies holes in the on-state for bipolar conduction. An n buffer layer 106 is located between the p+ collector layer 104 and the n-base region 108. A back metal contact 102 is located below the collector p+ layer 104.

The device 100 includes two active trenches 124 extending down into the n-base 108 from the surface of an n+ contact region (or a first contact region) 116. The active trenches 124 act as trench gates along which a MOS channel is formed in an on-state by application of a positive voltage. Above the n-base 108 and adjacent to the active trench 124, there is provided a p-well or p-body (or a body region) 112. Within the p-base or p-body region 112, the n+ contact region 116 of the emitter is formed.

An emitter p+ contact layer (or the second contact region) 114 is formed above the p-base (p-well layer) 112. An emitter metal contact 130 is located over the surface of the device, and extends down to contact the p+ contact 114 in the p-well region 112. Given that the emitter metal contact 130 is recessed from the surface of the device, the p+ contact layer 114 is located in a region below the n+ contact region 116.

The emitter contact layer 114 includes contacts C2 to the auxiliary trenches 118.

In this embodiment, four auxiliary trenches 118 are formed with two either side of the active trenches 124. The auxiliary trenches 118 are connected to the emitter metal contact 114. This means that the auxiliary trenches are biased at ground potential, and do not have a gate channel. This reduces capacitive coupling between the auxiliary trenches 118 and the active trenches 124, and therefore reduces $C_{GC}$, improves rate of turn-on dV/dt and dI/dt, and reduces gate charge. Furthermore, this allows a transient, fast discharge during turnoff, allowing $V_{CE}$ to rise faster.

Each trench 118, 124 includes vertical sidewalls and a bottom surface between the vertical sidewalls.

The active and auxiliary trenches 124, 118 can be doped polysilicon trenches with an oxide region on the sidewalls. The active trench 124 can also be a dielectric filled trench with a gate metal electrode within the trench.

The auxiliary trenches 118 have a uniform thin oxide layer 120 on the vertical sidewalls. The thin oxide layer has thickness between 500 Å and 1500 Å. This enables the formation of an inversion layer 122 around the auxiliary trenches 118 in the n-base region 108 and the n-well region 110. The inversion layer increases the build-up of plasma at turn-on and increased dI/dt.

Underneath the p-base (p-well layer) 112, and in contact with both the p-base 112 and the n-base layer 108, there is an n-well layer 110. This n-well layer 110 acts as a charge storage (CS) layer. The n-well layer 110 extends throughout the entire width of the device, including in the active area of the device and between adjacent auxiliary trenches 118. The n-well layer 110 acts a barrier to holes flowing towards the auxiliary trench emitter contacts C3, as the p-well/n-well junction potential is raised by the increased doping concentration of the n-well layer 110 over the n-base layer 108.

The inability for holes to freely flow to the auxiliary trench emitter contacts C3 increase storage charge, enhances conductivity modulation (i.e. modulates the resistivity) of silicon in the emitter side (or top cell) which reduces $V_{CE(sat)}$.

As the auxiliary trenches 118 are held at ground potential and have a thin oxide lining 20, the regions in contact with the n-base layer 108 and the n-well layer 110 can be easily inverted to create low resistance paths for holes to flow and be collected at the auxiliary trench emitter contacts C3. If a thick oxide layer was used instead of a thin oxide layer, ground potential (i.e. 0V) would not be sufficient to create a hole-inversion layer or to create a hole inversion layer strong enough to reduce $V_{CE(sat)}$.

In this embodiment, the active trenches 124 have an oxide layer having two thicknesses. One portion of the oxide layer has a greater thickness compared to another portion of the same oxide layer. The oxide layer with the greater thickness is referred to as a thick oxide layer 126 and the oxide layer of the same trench having a smaller thickness is referred to as a thin oxide layer 128. The same definitions apply to all the embodiments of the specification. The thick oxide layer 126 is generally located along the bottom surface and low sides (or lower portion of the vertical sidewalls) of the polysilicon filled trenches 115, 124. The thin oxide layer 128 is generally located along the conduction channel region (which is located along the upper portion of the vertical sidewalls of the trench) of the device, on the side of the active trenches 124 closest to the n+ contact region 116 and p+ contact region 114. The feature of trenches with a thick bottom oxide 126 improves immunity to high electric field stress and harnesses the device breakdown voltage.

The active trenches 124 have the thin oxide layer 128 on the vertical sidewall regions where electron conduction channels are formed. The active trenches 124 have a thick oxide layer or portion 126 on vertical sidewall regions where conduction channels or accumulation layers are not formed. This reduces the gate collector capacitance ($C_{GC}$) and improves the switching speed. This lowers or reduces the turn on energy loss ($E_{ON}$) and the turn off energy loss ($E_{OFF}$). An oxide layer 126 may be formed over the regions of the device not connected to the emitter potential.

The active trenches 124 have two sidewalls, and the conduction channel is formed along only one sidewall and no conduction channel is formed along another sidewall. The active trenches 124 have a thick oxide layer (or an oxide layer having a constant thickness) along a complete vertical sidewall of the trench, where the conduction channel is not formed. The active trenches 124 have a thick oxide layer 126 formed on the bottom surface and low sidewalls (of the trench), and a thin oxide layer 128 on the upper sidewalls where a conduction channel is formed.

The active trenches 124 are formed of (or may have) an upper portion and a lower portion. The upper portion extends for a length y1 downwards from the surface of the trench. The lower portion extends for a length y2 upwards from the bottom of the trench.

On trench sidewalls without a thick oxide layer on the upper portion, the transition from the thin oxide 128 to the thick oxide 126 on the vertical sidewalls of the trenches occurs at the boundary between the upper and lower portions. The transition occurs at a distance y1 from the top of the active trenches. The distance from the bottom of the active trenches to the transition from the thin oxide 128 to the thick oxide 126 is given by y2, in which generally y1/y2≥1 and adjusting this ratio alters the $C_{GC}$. In this way, y1 and y2 can be adjusted to tune the device performance.

The values of y1 and y2 may vary for different trenches within the same device. y2 may be greater than 0.5 μm. y1 can be least as large as the depth of the p-well region 112.

Figure 2:
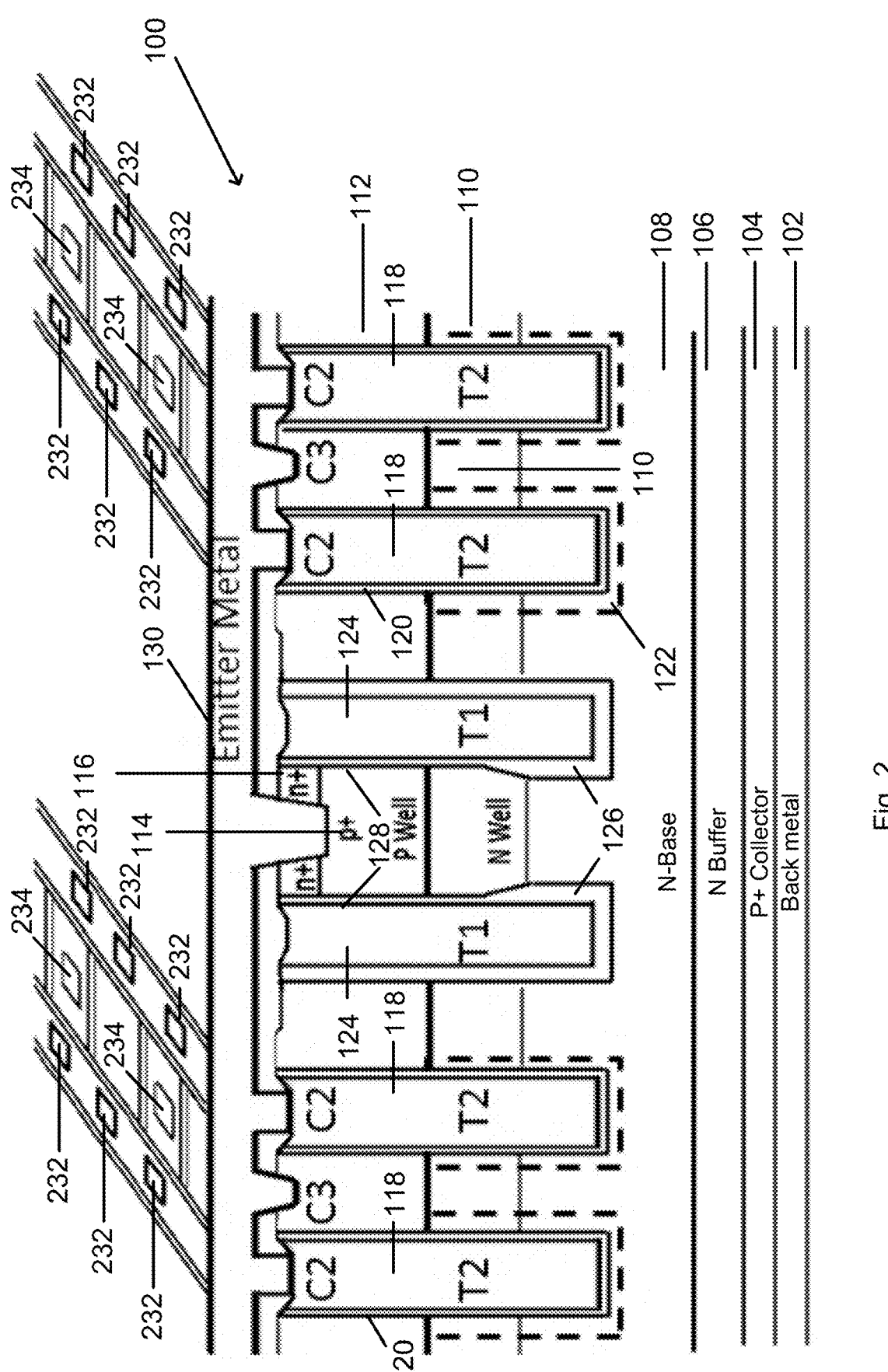
FIG. 2 illustrates a three dimensional (3D) cross-sectional view of a semiconductor device in which emitter contacts are connected to the p-well region between adjacent auxiliary trenches, according to an embodiment of the disclosure.

FIG. 2 illustrates a 3D cross-sectional view of a semiconductor device 100 in which emitter contacts are connected to the p-well region 112 between adjacent auxiliary trenches, according to an embodiment of the disclosure. In this embodiment. In this embodiment, the emitter metal contact 130 also includes contacts C3 234 to the p-well regions 112 between adjacent auxiliary trenches 118 as well as separate contacts C2 232 to the auxiliary trenches 118. The hole inversion layer 122 creates a low resistance path to improve efficiency of collecting holes using the contact 234. This means that excess holes in the p-well regions 112 between auxiliary trenches 118 can be quickly collected at the onset of turn-off. This increases the speed at which the depletion edge spreads from the pn junction. The faster extraction rate of holes during device turn-off increases the rate in Vce increase and increases turn-off dV/dt.

The contacts 234 to the p-well regions are formed in isolated regions bound by trenches. This is because continuous contact would destroy the hole storage effect produced by the thin oxide layer 120 and the n-well region 110 between auxiliary trenches 118. Therefore providing isolated contacts avoids reducing current density and increasing $V_{CE(sat)}$.

FIG. 2 also shows the emitter metal contacts 232 to the auxiliary trenches 118 that bias the auxiliary trenches 118 at ground potential. In this embodiment, there are multiple, separate contacts 232 to each auxiliary trench 118.

From this Figure, it can be seen that the trenches 118, 124 are spaced from each other in a first dimension, and each extend in the device 100 in a second dimension. There are multiple contacts 234 to each p-well region 112, spaced from each other in a third dimension, where all three dimensions are perpendicular to each other.

Figure 3:
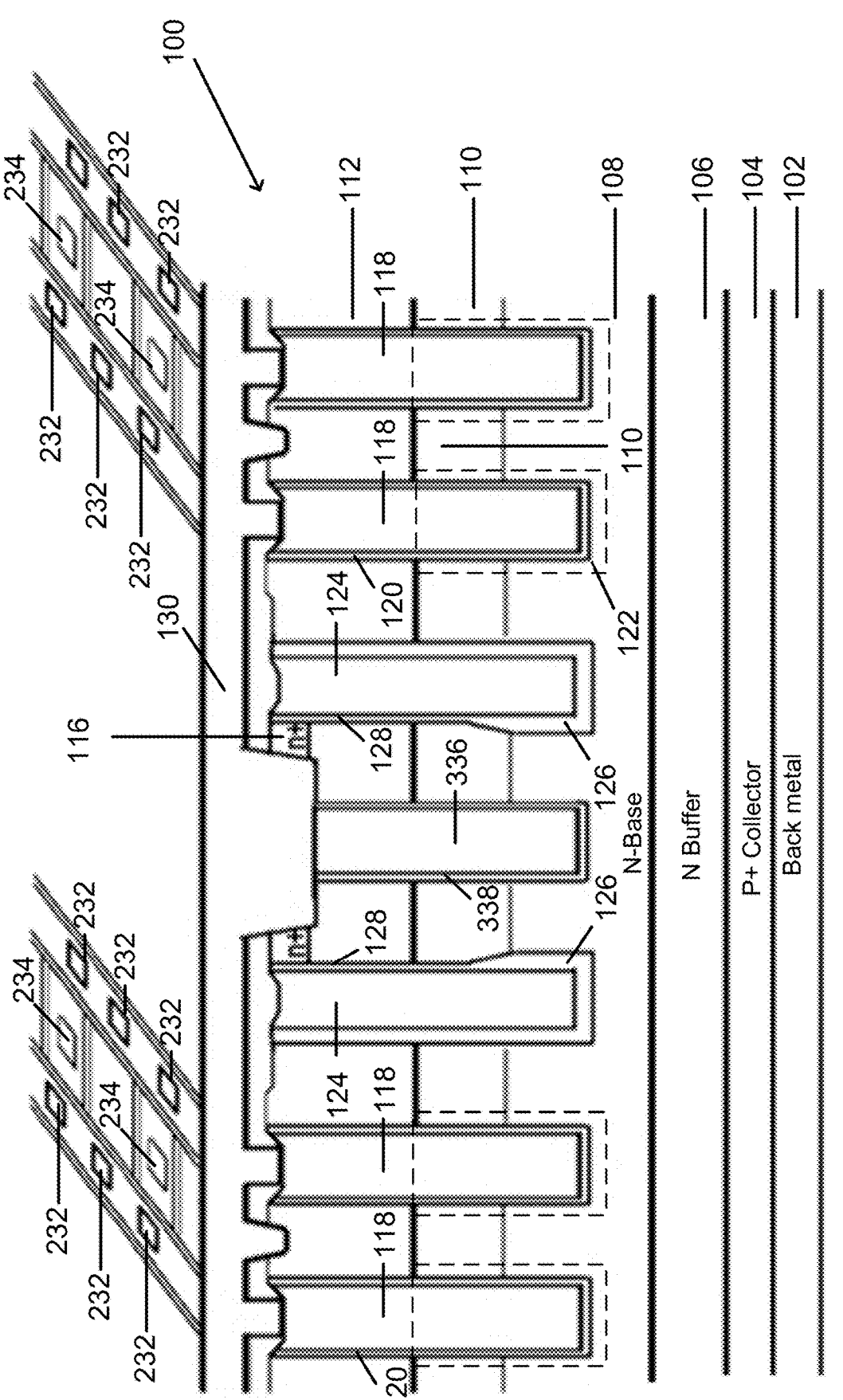
FIG. 3 illustrates a 3D cross-sectional view of a semiconductor device in which the device includes a recessed emitter trench, according to an embodiment of the disclosure.

FIG. 3 illustrates a 3D cross-sectional view of a semiconductor device 100 in which the device includes a recessed emitter trench 336, according to an embodiment of the disclosure. An emitter trench 336 is formed which is laterally spaced from the active trenches 124. In this embodiment, the emitter trench 336 is formed between the two active trenches 124, extending down, and recessed from the top surface of the p-well region 112 and below a junction between the n+ contact region 116 of the emitter and the p-base (p-well region) 112. The use of a recessed emitter trench means it is possible to have trench-to-trench separation less than or equal to about 0.5 μm without photolithographic limitations. This reduces the mesa dimension and enhances conductivity modulation in the top cell of the device.

The emitter trench 336 is a doped polysilicon trench with an oxide region on the sidewalls. The emitter trench 336 can also be a dielectric filled trench with or without a metal electrode within. The recessed emitter trench 336 has a thin oxide insulation layer 338 on the vertical sidewalls and the bottom surface.

The emitter trench 336 is connected to the emitter metal contact 130 and connected to the emitter potential. In this example, the emitter trench 115 is generally grounded in all modes of operation.

Figure 4:
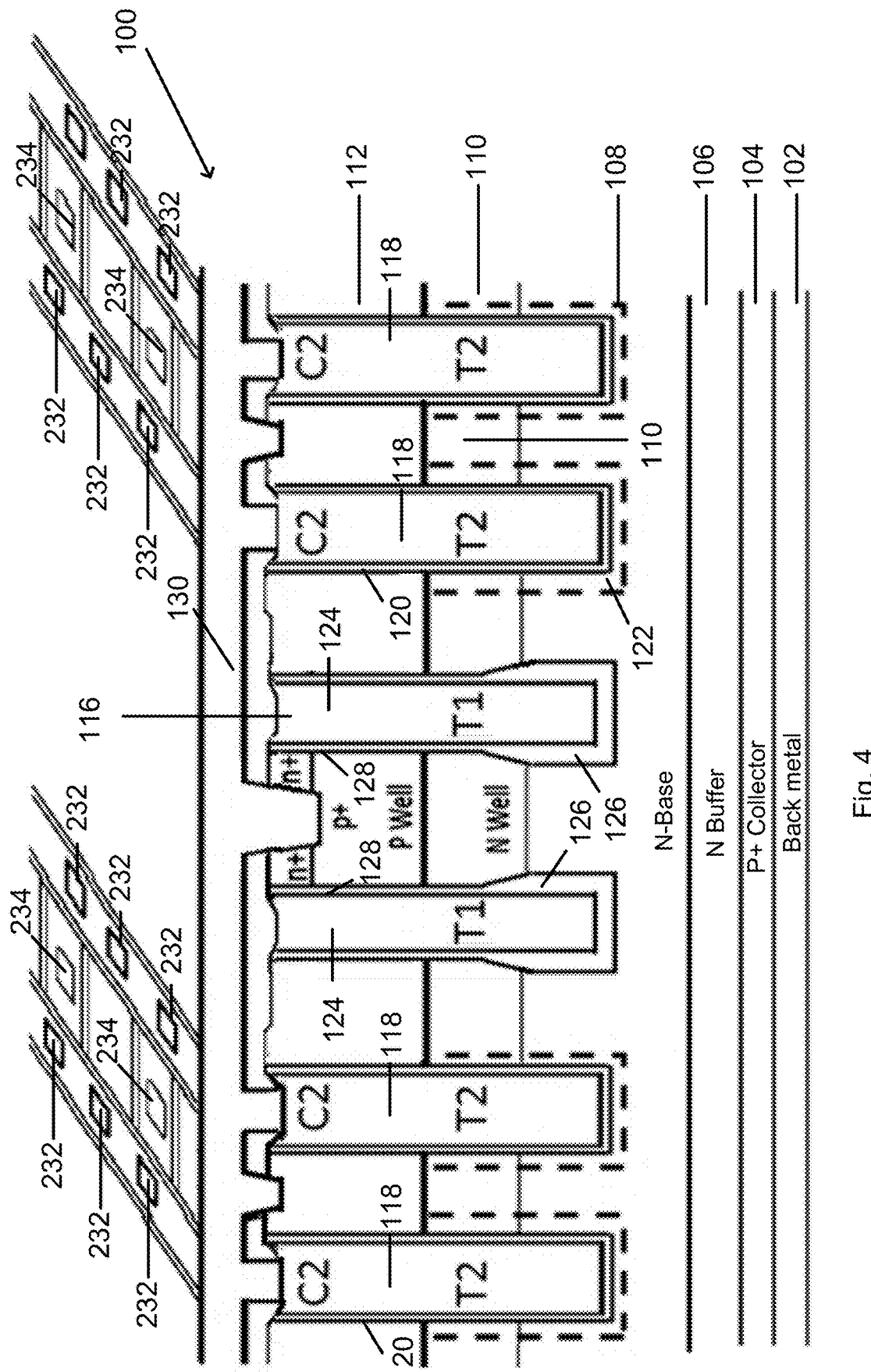
FIG. 4 illustrates a 3D cross-sectional view of a semiconductor device in which the active trenches have symmetric oxide insulation layers, according to an embodiment of the disclosure.

FIG. 4 illustrates a cross-sectional view of a semiconductor device 100 in which the active trenches have symmetric oxide insulation layers, according to an embodiment of the disclosure. Whilst there is no emitter trench in this embodiment shown, other possible embodiments could have an emitter trench between the two active trenches 124.

Figure 5:
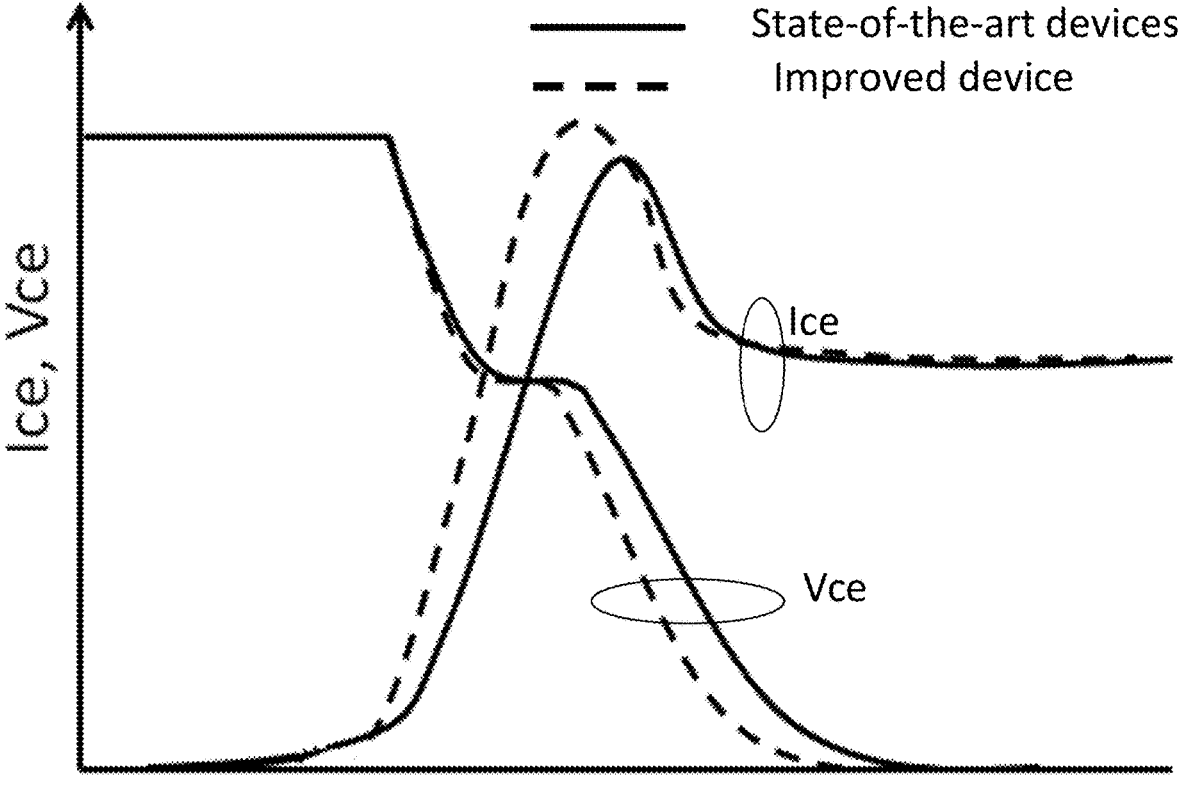
FIG. 5 shows the progression of potential difference between collector and emitter ($V_{CE}$) and collector emitter current ($I_{CE}$) from turn-on, for both a state-of-the-art device and a device according to an embodiment of the disclosure.

FIG. 5 shows the progression of Vce and Ice from turn-on, for both a state-of-the-art device and a device according to an embodiment of the disclosure. This shows increased dI/dt during turn on compared to the state of the art device. This occurs as the n-well regions under the p-well in the dummy region (region between adjacent dummy trenches) help with the build of charge within the device, and the grounding of the dummy trenches eliminates coupling with between dummy and active trenches, hence $C_{GC}$ is reduced.

Figure 6A:
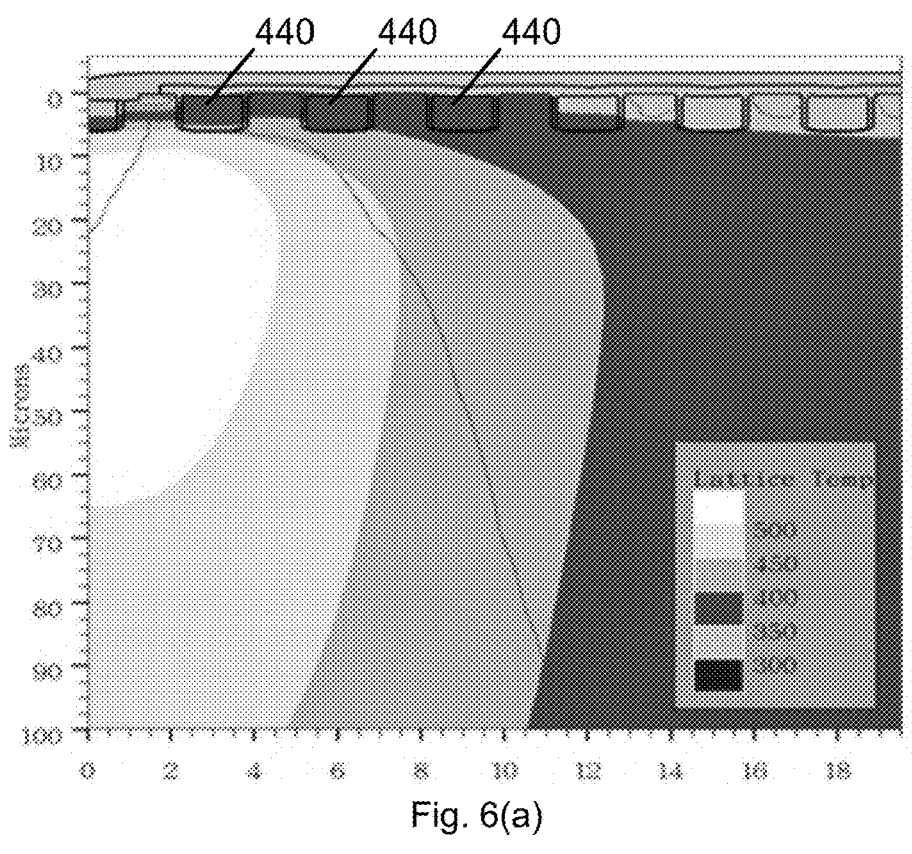
FIG. 6($a$) shows simulated temperature in a semiconductor device in which the auxiliary trenches are not biased at ground potential.

FIG. 6(a) shows simulated temperature in a semiconductor device in which the auxiliary trenches 440 are not biased at ground potential.

Figure 6B:
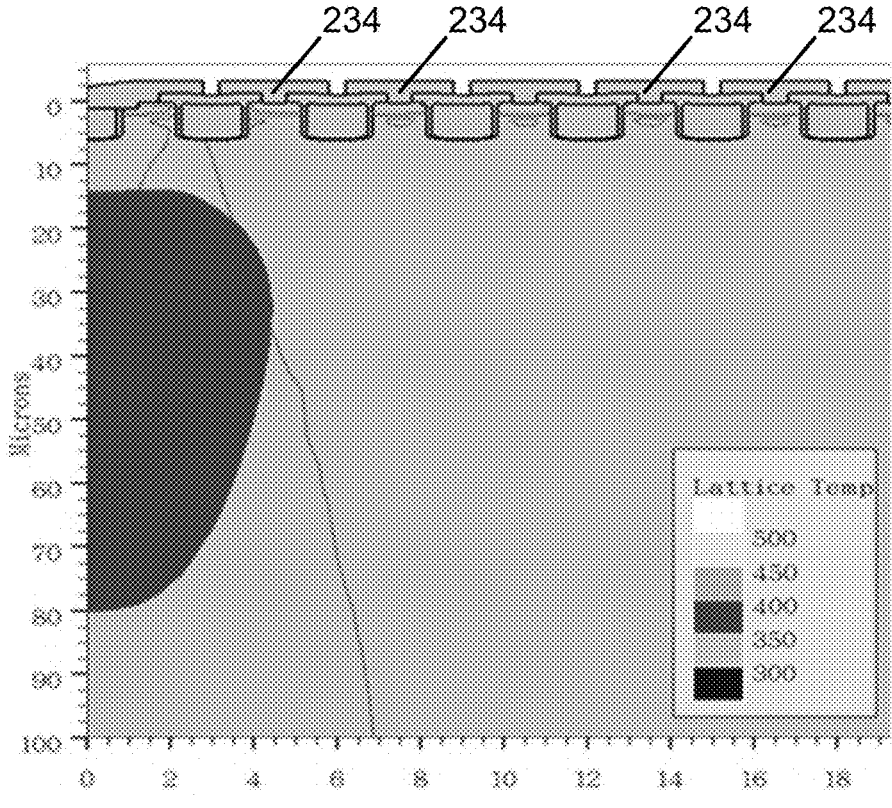

FIG. 6(b) shows simulated temperature in a semiconductor device in which the region between auxiliary trenches 234 is biased at ground potential, according to an embodiment of the disclosure. FIGS. 6(a) and 6(b) both a 3.3 kV IGBT. The maximum chip temperature has been reduced from 500K to 400K, i.e. by 100K, by use of a contact to the regions between dummy trenches.

FIGS. 7(a) to 7(h) shows steps in the manufacturing method of a semiconductor device, according to an embodiment of the disclosure;

FIG. 7(a) illustrates the first step of manufacturing the trenches of the semiconductor device, which is as follows:

(a) Step 1

Trenches 905 are etched.

An initial oxide layer 910 is formed over the trenches. The initial oxide layer 910 is a sacrificial oxidation layer. It is an oxide layer created immediately after silicon etch to create trenches. The main purpose of this layer is to remove surface roughness created by the trench etch process. Traditionally, this oxide is later removed prior to formation of the thin gate oxide.

A hydrophilic layer 915 such as nitride is deposited over the initial oxide layer 910. The nitride layer 915 has a thickness of approximately 1000 Å to 2500 Å.

A thin oxide layer 920 is deposited using TEOS over the hydrophilic layer 915. The thin oxide layer 920 has thickness of approximately 500 Å to 1800 Å.

FIG. 7(b) illustrates the second step of manufacturing the trenches of the semiconductor device, which is as follows:

(b) Step 2

Photolithography is performed to apply a photoresist mask 925 that fills the trenches, where the mask ends in the centre of one trench 930 (for example, the active trench) and at least one other trench 935 (for example, a dummy trench). This leaves half of the active trench and the dummy trench exposed, as well as the mesa region between the trenches.

The photoresist 925 is deposited such that the thin oxide layer 920 is exposed on a first side of each trench for which asymmetric oxide will be manufactured, and in the mesa region 940 between trenches.

The first side of each trench (the side where the thin oxide layer 920 is exposed) is the side of the trench that will be manufactured to have a thick oxide layer, whilst the side of each trench that will be manufactured to have thin oxide or oxide of different thickness remains covered by the photoresist.

FIG. 7(c) illustrates the first step of manufacturing the trenches of the semiconductor device, which is as follows:

(c) Step 3

A wet etch is performed on the thin oxide layer 920. The etch may be performed by immersing the whole wafer in a BOE (buffered oxide etch) such as 7:1 HF. The buffered oxide etchant etches the oxide layer 920 on the exposed mesa region 940, the exposed trench sidewalls and bottom, and the trench sidewalls extending up from the trench bottom to a desired height Y above the bottom surface of the trench.

The hydrophilic layer 915 creates a capillary action so that the etchant etches the oxide layer 920 along the narrow channel between the hydrophilic layer 915 itself and the photoresist 925.

The presence of the hydrophilic layer 915 allows control of the etch depth and uniformity of the etch process. The hydrophilic layer 915 reduces defects formed during the etch process.

FIG. 7(d) illustrates the first step of manufacturing the trenches of the semiconductor device, which is as follows:

(d) Step 4

The photoresist is stripped (removed) using any suitable wet or dry chemistry.

An etch process is performed to remove the exposed regions of the hydrophilic layer 915. The etch process can be a wet or dry etch, and stops on the initial oxide layer 910.

In embodiments where the hydrophilic layer 915 is nitride, the etch process may be done in plasma ambient using CF4/HBr chemistry.

FIG. 7(e) illustrates the first step of manufacturing the trenches of the semiconductor device, which is as follows:

(e) Step 5

A thick oxide layer 945 is thermally grown or deposited on the sidewalls and bottom surface of the trenches in areas without the hydrophilic layer 915 remaining. The thick oxide layer 945 may be deposited using loyal oxidation of silicon (LOCOS). The thick oxide layer 945 has a thickness of approximately 1800 Å to 5000 Å.

FIG. 7(f) illustrates the first step of manufacturing the trenches of the semiconductor device, which is as follows:

(f) Step 6

An etch process is performed to remove the remaining regions of the hydrophilic layer 915 and the remaining TEOS 920.

FIG. 7(g) illustrates the first step of manufacturing the trenches of the semiconductor device, which is as follows:

(g) Step 7

Photolithography is performed to apply a photoresist mask 950 that fills the active trench 930, where the mask leaves the dummy trenches 935 exposed.

A wet etch process is performed that strips the dummy trenches 935 to the silicon layer.

FIG. 7(h) illustrates the first step of manufacturing the trenches of the semiconductor device, which is as follows:

(h) Step 8

A thin oxidation layer 955 is grown on the dummy trenches having a constant thickness on the sidewalls and bottom surfaces. The thin oxide 955 layer may be is grown in a furnace step at 900° C. to 1100° C. The thin oxide layer 955 has thickness of approximately 500 Å to 1800 Å.

The photoresist is stripped (removed) using any suitable wet or dry chemistry.

Polysilicon 960 is deposited to fill the trenches. The polysilicon 960 is planarized by etching the top of the polysilicon 960 to level off with the silicon in the mesa region between the trenches.

Figure 7:
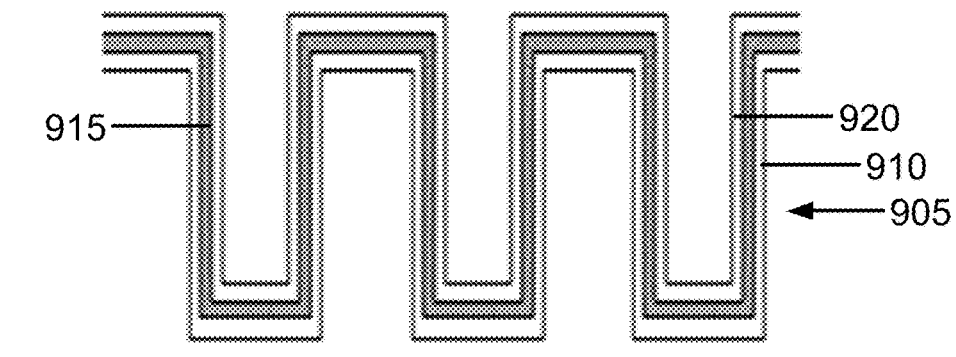
FIGS. 7($a$) to 7($h$) shows steps in the manufacturing method of a semiconductor device, according to an embodiment of the disclosure.
Figure 7:
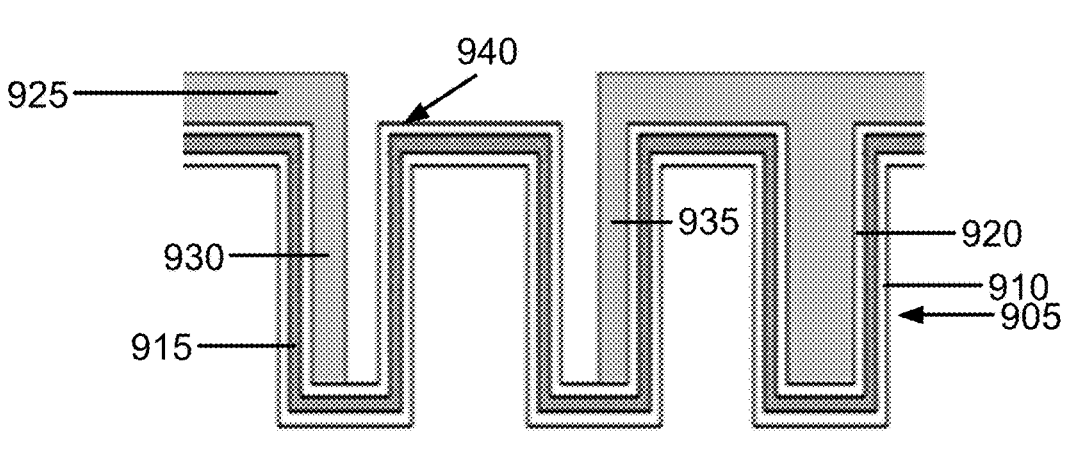
Figure 7:
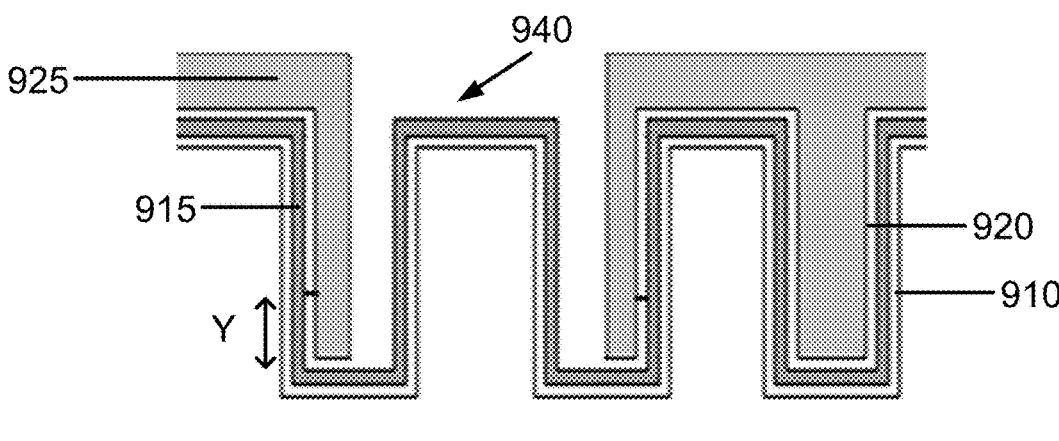
Figure 7:
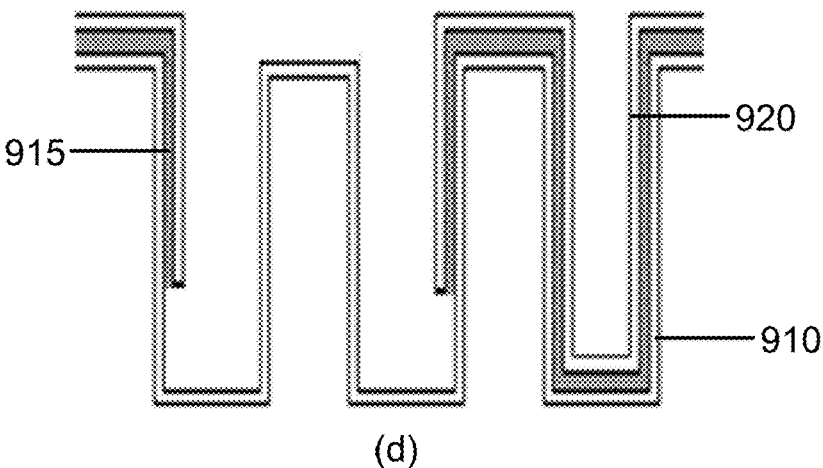
Figure 7:
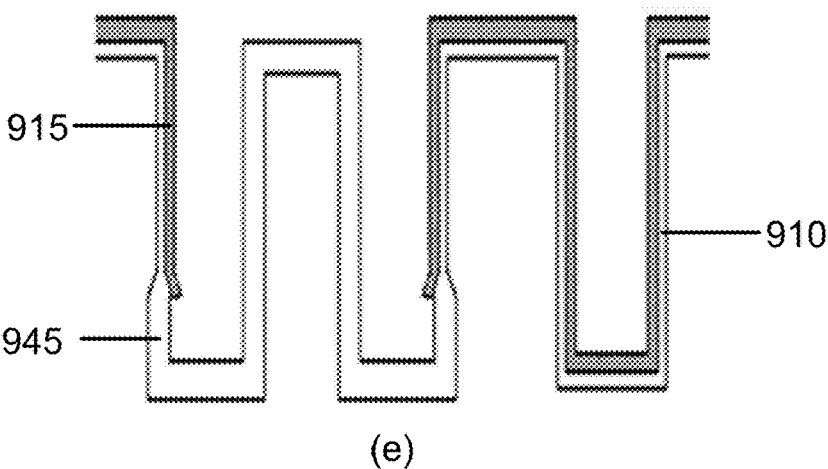
Figure 7:
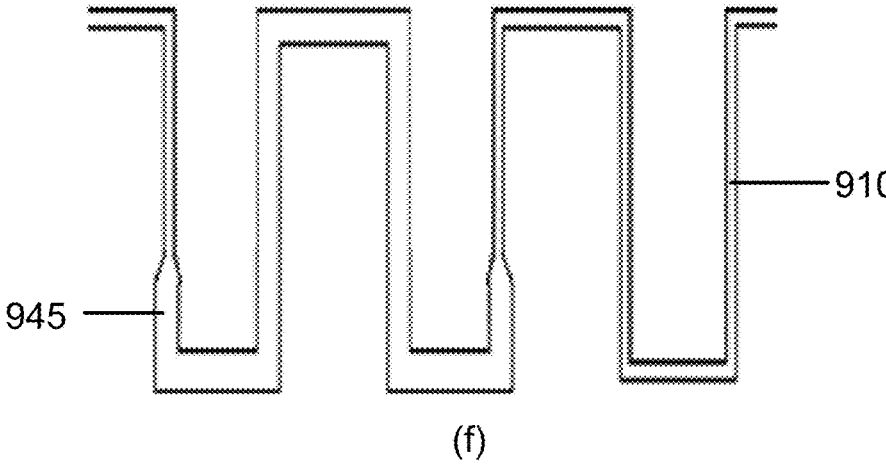
Figure 7:
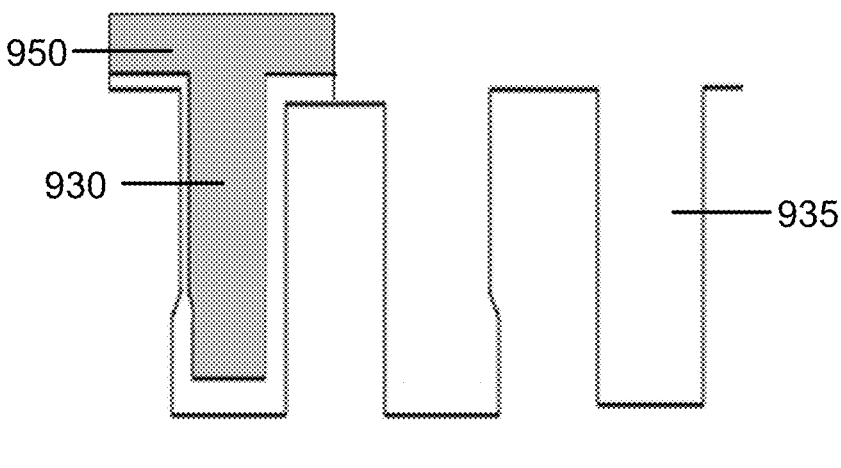
Figure 7:
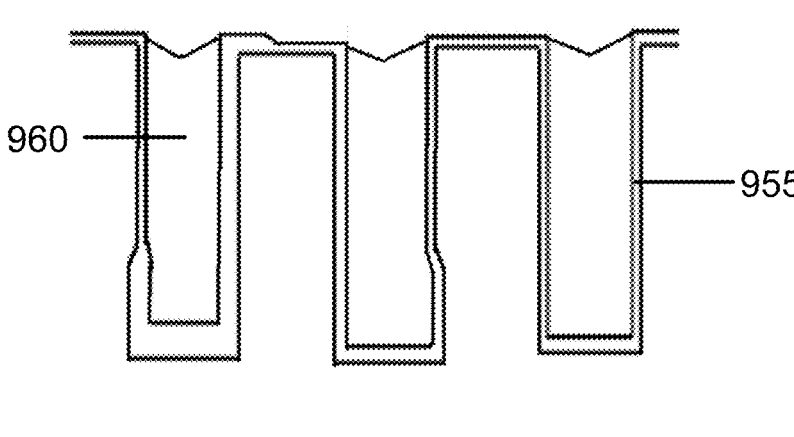
Figure 8:
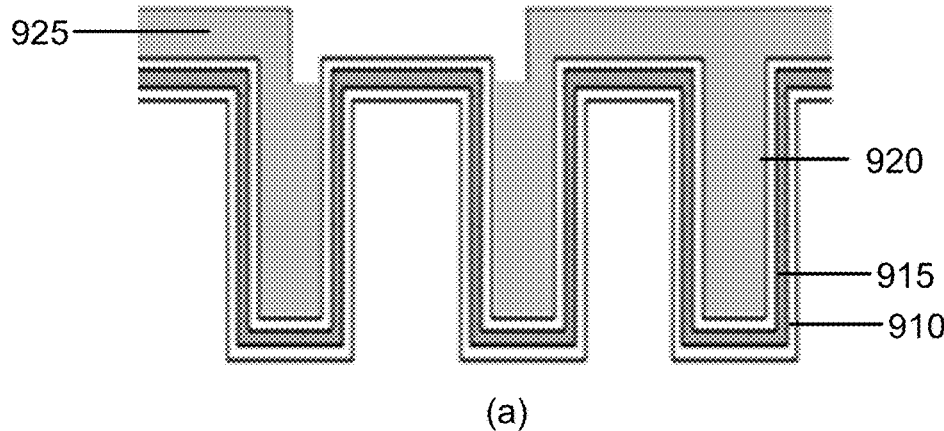
FIGS. 8($a$) and 8($b$) shows in further details the steps of FIGS. 7($b$) and 7($c$), according to an embodiment of the disclosure.
Figure 8:
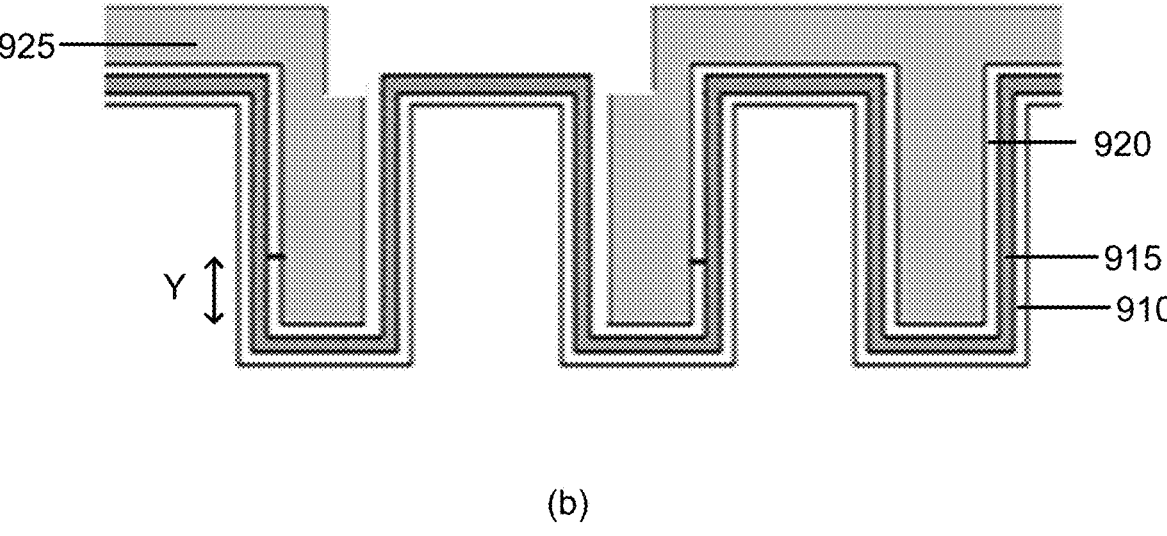

FIGS. 8(*a*) and 8(*b*) shows in further details the steps of FIGS. 7(*b*) and 7(*c*), according to an embodiment of the disclosure. FIG. 8(*a*) shows photolithography with mask edges down the middle of the active trench and at least one dummy trench. FIG. 8(*b*) shows an etch process to remove the TEOS 920. Capillary action in the etch solution enables etching up a second trench side wall by distance Y.

Figure 9:
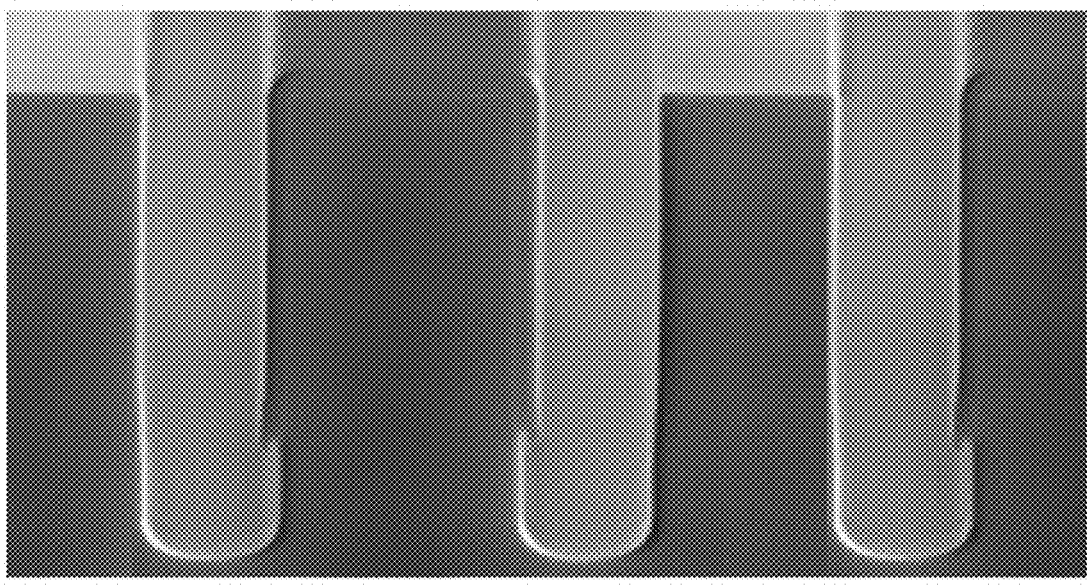
FIG. 9 shows an example of a semiconductor device manufactured using the steps of FIGS. 7($a$) to 7($h$).

FIG. 9 shows an example of a semiconductor device manufactured using the steps of FIGS. 7(*a*) to 7(*h*).

The skilled person will understand that in the preceding description and appended claims, positional terms such as 'above', 'overlap', 'under', 'lateral', 'vertical', etc. are made with reference to conceptual illustrations of a semiconductor device, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

It will be appreciated that all doping polarities mentioned above could be reversed, the resulting devices still being in accordance with the present invention. It will be appreciated that the emitter, collector and trench gate (active trench) could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A gate controlled bipolar semiconductor device comprising:

a collector region of a first conductivity type;

a drift region of a second conductivity type located over the collector region;

a body region of a first conductivity type located over the drift region;

a body region of a second conductivity type located over the drift region;

at least one first contact region of a second conductivity type located above the body region and having a higher doping concentration compared to the body regions;

at least one second contact region of a first conductivity type located laterally adjacent to the at least one first contact region, the at least one second contact region having a higher doping concentration than the body regions;

at least one active trench extending from a surface into the drift region, wherein the at least one first contact region adjoins at least one active trench so that, in use, a channel region is formed along said at least one active trench and within the body regions, and

at least two auxiliary trenches extending from the surface into the drift region, and wherein the at least two auxiliary trenches each comprise:

two vertical sidewalls and a bottom surface between the two vertical sidewalls; and an insulation layer along the vertical sidewalls and the bottom surface, wherein the thickness of the insulation layer along the two vertical sidewalls of the at least two auxiliary trenches is less than 1500 Å;

wherein the body region of a first conductivity type and the body region of a second conductivity type are both located at least between two adjacent auxiliary trenches;

wherein the at least one active trench and the auxiliary trenches are spaced in a first dimension, the active trenches and auxiliary trenches extending in the device in a second dimension, and further comprising a metal emitter contact, wherein the metal emitter contact is connected to the at least two auxiliary trenches, wherein the metal emitter contact is electrically connected to the body region of a first conductivity type located at least between adjacent auxiliary trenches; and wherein the metal emitter contact is connected to the at least two auxiliary trenches by a plurality of separate contacts to each trench.

2. A device according to claim 1, wherein the insulation layer along the two vertical sidewalls of the at least two auxiliary trenches comprises a substantially constant thickness; or the device is configured such that the at least two auxiliary trenches are biased at a ground potential.

3. A device according to claim 1, further comprising an emitter trench extending from the surface into the drift region, and wherein the second contact region adjoins the emitter trench.

4. A device according to claim 3, wherein the emitter trench is located between two active trenches; or the device is configured such that the emitter trench is biased at ground potential, wherein the metal emitter contact is connected to the emitter trench.

5. A device according to claim 3, wherein the active trench and the emitter trench are laterally spaced in a first dimension, and wherein current flows in the device in a second dimension substantially transverse to the first dimension, and wherein the active trench and emitter trench extend in a third dimension of the device.

6. A device according to claim 5, wherein the second contact region is formed at least partially within the emitter trench in the third dimension of the device; or the second contact region does not extend into the body region of a first conductivity type or the body region of a second conductivity type, between the active trench and the emitter trench; or the emitter trench comprises a plurality of segments in the third dimension, wherein the segments are shaped such that at least a space is formed between two segments, wherein the second contact region may comprise a plurality of portions in the third dimension, each portion being located within the space formed between two segments of the emitter trench.

7. A device according to claim 3, wherein the emitter trench is recessed from a surface of the device and wherein the device further comprises a region adjacent to the emitter trench, wherein the region comprises a first recessed portion extending from the surface of the device to the emitter trench; or the emitter trench comprises:

two vertical sidewalls and a bottom surface between the two vertical sidewalls, and an insulation layer along the vertical sidewalls and the bottom surface, wherein the insulation layer along the two vertical sidewalls of the emitter trench comprises a substantially constant thickness and wherein the thickness of the insulation layer along the two vertical sidewalls of the emitter trench is less than 1500 Å.

8. A device according to claim 1, wherein the metal emitter contact is electrically connected to the body region of a first conductivity type located at least between adjacent auxiliary trenches by a plurality of isolated electrical contact regions each between the adjacent auxiliary trenches.

9. A device according to claim 8, wherein the isolated contact regions between the adjacent auxiliary trenches are formed in isolated regions bound by trenches.

10. A device according to claim 1, wherein the at least one active trench comprises:

two vertical sidewalls and a bottom surface between the two vertical sidewalls; and an insulation layer along the vertical sidewalls and the bottom surface, wherein the insulation layer along at least one vertical sidewall of the at least one active trench comprises different thicknesses.

11. A device according to claim 10, wherein the insulation layer along at least one vertical sidewall of the at least one active trench comprises a region with thickness greater than 2500 Å; or the insulation layer along said at least one vertical sidewall of the auxiliary trench comprises a smaller thickness compared to the thickness of the insulation layer along the channel region of the at least one active trench; or in the at least one active trench, the insulation layer along both vertical sidewalls comprises different thicknesses, wherein the thickness of the insulation layer along a lower portion of each vertical sidewall of the at least one active trench is greater than the thickness of the insulation layer along an upper portion of each vertical sidewall of the at least one active trench; or in the at least one active trench, the insulation layer along one vertical sidewall comprises different thicknesses and the insulation layer along another vertical sidewall comprises a constant thickness, wherein the thickness of the insulation layer along a lower portion of a first vertical sidewall of the at least one active trench is greater than thickness of the insulation layer along an upper portion of a first vertical sidewall of the at least one active trench, and wherein the thickness of the insulation layer along a lower portion of a second vertical sidewall of the at least one active trench is the same as the thickness of an upper portion of a second vertical sidewall of the at least one active trench.

12. A device according to claim 1, wherein each body region of a first conductivity type between two adjacent auxiliary trenches further comprises a plurality of emitter contacts spaced in a third dimension, wherein the three dimensions are mutually perpendicular.

13. A device according to claim 1, wherein the emitter metal contact extends below an upper surface of the body region of a first conductivity type located at least between adjacent auxiliary trenches.

14. A method of manufacturing a gate controlled bipolar semiconductor device comprising:

forming a collector region of a first conductivity type;

forming a drift region of a second conductivity type located over the collector region;

forming a body region of a first conductivity type located over the drift region;

forming a body region of a second conductivity type located over the drift region;

forming at least one first contact region of a second conductivity type located above the body region and having a higher doping concentration compared to the body region;

forming at least one second contact region of a first conductivity type located laterally adjacent to the at least one first contact region, the at least one second contact region having a higher doping concentration than the body region;

forming at least one active trench extending from a surface into the drift region, wherein the at least one first contact region adjoins at least one active trench so that, in use, a channel region is formed along said at least one active trench and within the body region, and forming at least two auxiliary trenches extending from the surface into the drift region, and wherein the at least two auxiliary trenches each comprise:

two vertical sidewalls and a bottom surface between the two vertical sidewalls; and an insulation layer along the vertical sidewalls and the bottom surface, wherein the thickness of the insulation layer along the two vertical sidewalls of the at least two auxiliary trenches is less than 1500 Å, and wherein the body region of a first conductivity type and the body region of a second conductivity type are both located at least between two adjacent auxiliary trenches; and wherein the at least one active trench and the auxiliary trenches are spaced in a first dimension, the active trenches and auxiliary trenches extending in the device in a second dimension, and forming a metal emitter contact wherein the metal emitter contact is connected to the at least two auxiliary trenches, wherein the metal emitter contact is electrically connected to the body region of a first conductivity type located at least between adjacent auxiliary trenches and wherein the metal emitter contact is connected to the at least two auxiliary trenches by a plurality of separate contacts to each trench.

15. A method according to claim 14, wherein at least one active trench and at least one auxiliary trench are manufactured using the steps of:

performing an etching process to form the one or more trenches;

forming a first insulation layer on a lower surface and sidewalls of the one or more trenches;

depositing a hydrophilic layer on the lower surface and sidewalls of the one or more trenches;

depositing a photoresist material in the one or more trenches, wherein depositing a photoresist material comprises exposing the hydrophilic layer on an upper region of a first side of the one or more trenches;

performing a wet etch process to etch the first insulation layer on the sidewall of the first side of the one or more trenches to a predetermined distance below a surface of the photoresist material;

removing the photoresist material;

removing the hydrophilic layer; and after performing the wet etch process, removing the photoresist material, and removing the hydrophilic layer; forming a second insulation layer on the sidewall of the first side of the one or more trenches.

16. A method according to claim 15, wherein forming a first insulation layer comprises forming a thin insulation layer, and wherein forming a second insulation layer comprises forming a thick insulation layer over the thin insulation layer, wherein the thin insulation layer is thinner than the thick insulation layer; and optionally wherein forming a thick insulation layer comprises thermally growing a thick oxide layer using a local oxidation of silicon process; or wherein forming a thick insulation layer comprises depositing a thick oxide layer, wherein depositing a thick oxide layer may be carried out using Tetraethyl Orthosilicate (TEOS); or wherein the thick insulation layer has a thickness greater than 2500 Å; or growing a thin insulation layer comprises thermally growing a thin oxide layer at 900° C. to 1100° C.; or wherein the thin insulation layer has a thickness less than 1500 Å.

17. A method according to claim 15, wherein the method further comprises depositing a filling material after forming the second insulation layer; or the hydrophilic layer comprises nitride; or the hydrophilic layer has a thickness between 1300 Å and 2500 Å; or the step of performing a wet etch is carried out using a buffered oxide etch, wherein the buffered oxide etch may comprise hydrofluoric acid; or the method comprises manufacturing one or more trenches with an asymmetric insulation layer; or the method comprises manufacturing one or more trenches with a symmetric insulation layer, and wherein depositing a photoresist material comprises exposing the hydrophilic layer on an upper region of two sides of the one or more trenches, and wherein the method further comprises:

performing a wet etch process to etch the insulation layer on two sidewalls of the one or more trenches to a predetermined distance below a surface of the photoresist material; and growing a thin insulation layer on the two sidewalls of the one or more trenches.

18. A method according to claim 15, wherein the method comprises manufacturing at least two trenches each with an insulation layer, wherein a first trench is separated from a second trench by a mesa region between the two trenches; and wherein the first side of the first trench is adjacent to the first side of the second trench; and wherein depositing a photoresist material comprises exposing the hydrophilic layer in the mesa region between the first and second trenches; and optionally wherein the method further comprises removing the hydrophilic layer in the mesa region between the two trenches; or the method further comprises performing a wet etch process to etch the insulation layer on the mesa region.

* * * * *